(12) United States Patent
Yamaguchi et al.

(10) Patent No.: US 7,989,236 B2
(45) Date of Patent: Aug. 2, 2011

(54) METHOD OF MAKING PHOSPHOR CONTAINING GLASS PLATE, METHOD OF MAKING LIGHT EMITTING DEVICE

(75) Inventors: Seiji Yamaguchi, Aichi-ken (JP); Takashi Nonogawa, Aichi-ken (JP); Yoshinobu Suehiro, Aichi-ken (JP); Hiroki Watanabe, Saitama-ken (JP); Kazuya Aida, Saitama-ken (JP)

(73) Assignees: Toyoda Gosei Co., Ltd., Nishikasugai-Gun, Aichi-Ken (JP); Sumita Optical Glass, Inc., Saitama-Shi, Saitama-Ken (JP)

( * ) Notice: Subject to any disclaimer, the term of this patent is extended or adjusted under 35 U.S.C. 154(b) by 233 days.

(21) Appl. No.: 12/318,150

(22) Filed: Dec. 22, 2008

(65) Prior Publication Data
US 2009/0186433 A1 Jul. 23, 2009

(30) Foreign Application Priority Data

Dec. 27, 2007 (JP) ................................ 2007-336663
Sep. 30, 2008 (JP) ................................ 2008-253608

(51) Int. Cl.
*H01L 21/00* (2006.01)

(52) U.S. Cl. ................ 438/26; 438/22; 438/27; 257/79; 257/88; 257/98; 257/100; 257/E21.001

(58) Field of Classification Search .................... None
See application file for complete search history.

(56) References Cited

U.S. PATENT DOCUMENTS

| | | | |
|---|---|---|---|
| 6,642,618 B2 | 11/2003 | Yagi et al. | |
| 2002/0070449 A1 | 6/2002 | Yagi et al. | |
| 2004/0104391 A1* | 6/2004 | Maeda et al. | 257/79 |
| 2006/0049421 A1* | 3/2006 | Suehiro et al. | 257/99 |

FOREIGN PATENT DOCUMENTS

| | | |
|---|---|---|
| JP | 2002-203989 | 7/2002 |
| JP | 2003-258308 | 9/2003 |
| JP | 2006-253336 | 9/2006 |

\* cited by examiner

*Primary Examiner* — N Drew Richards
*Assistant Examiner* — Kyoung Lee
(74) *Attorney, Agent, or Firm* — McGinn IP Law Group, PLLC

(57) ABSTRACT

A method of making a light emitting device includes mixing a glass powder with a phosphor powder including at least one of a sulfide phosphor, an aluminate phosphor and a silicate phosphor to produce a mixed powder in which the phosphor powder is dispersed in the glass powder, heating and softening the mixed powder to provide an integrated material, and subsequently solidifying the integrated material to provide a phosphor-dispersed glass, and fusion-bonding the phosphor-dispersed glass onto a mounting portion on which a light emitting element is mounted by hot pressing, and simultaneously sealing the light emitting element with the phosphor-dispersed glass on the mounting portion.

18 Claims, 8 Drawing Sheets

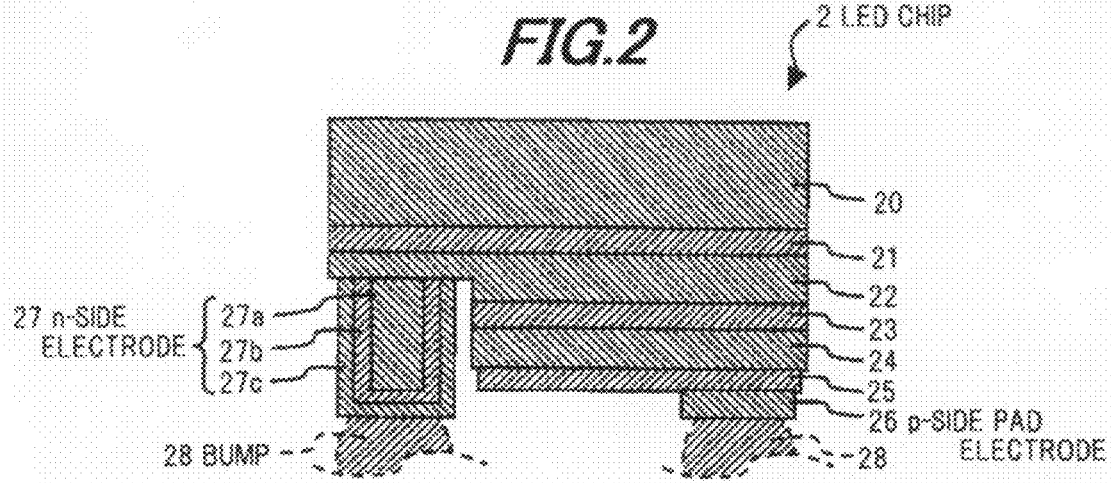
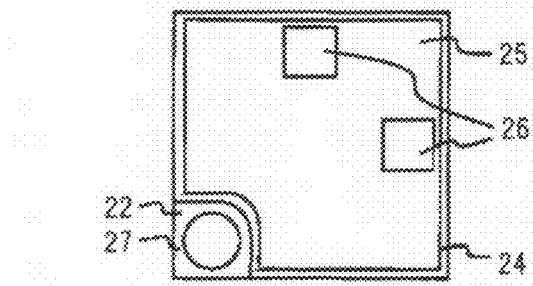 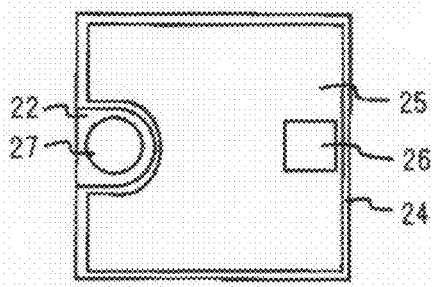

6 GLASS SEALING PORTION
43
2 LED CHIP
4 WIRING
4
43 VIA
2

GLASS SEALED LED (GREEN PHOSPHOR)

RESIN SEALED LED (GREEN PHOSPHOR)

GLASS SEALED LED (RED PHOSPHOR)

RESIN SEALED LED (RED PHOSPHOR)

METHOD OF MAKING PHOSPHOR CONTAINING GLASS PLATE, METHOD OF MAKING LIGHT EMITTING DEVICE

The present application is based on Japanese patent application Nos. 2007-336663 and 2008-253608 filed Dec. 27, 2007 and Sep. 30, 2008, respectively, the entire contents of which are incorporated herein by reference.

BACKGROUND OF THE INVENTION

1. Field of the Invention

This invention relates to a method of making a phosphor containing glass plate and to a method of making a light emitting device by using the phosphor containing glass plate.

2. Description of the Related Art

In recent years, white LED (light emitting diode) lamps for emitting white light are practically used as a lighting system, a backlight for LCD (liquid crystal display) etc.

In general, the white LED lamps are composed of a blue LED chip which is made of a group III nitride-based compound semiconductor for emitting blue light, and a transparent resin which is made of epoxy system, silicone system etc. for sealing the LED chip and contains a yellow phosphor powder that emits yellow wavelength-converted light by being excited by light emitted from the LED chip.

In order to have a high color rendering property than the above white LED lamps, a white LED lamp has been proposed that seals the LED chip with the transparent resin which contains green and red phosphor powders as well as the yellow phosphor powder.

For example, related arts to the invention are as follows.
JP-A-2006-253336
JP-A-2002-203989
JP-A-2003-258308

However, since the conventional white LED lamps use the transparent resin as the sealing material, the transparent resin near the LED chip may be yellowed due to light or heat etc. from the LED chip, so that the light extraction efficiency will deteriorate with time. In particular, the yellowing of the transparent resin is notably caused when a short-wavelength LED chip for emitting blue light etc. with high energy.

Further, since the transparent resin has permeability to gases, the phosphor powder contained in the transparent resin may be reacted with gas (especially moisture) in the air, so that the phosphor characteristics can often deteriorate with time. The deterioration of characteristics is notably caused in a sulfide phosphor, an aluminate phosphor and a silicate phosphor which are easy hydrolyzed and low in moisture resistance. Because of this, it is difficult to keep the characteristics of these phosphors although they can be used as high excitation efficiency green or red phosphor.

As described, sealing by the transparent resin is insufficient to meet the heat resistance, the light resistance and the impermeability to gases which are demanded for LED lamps.

In order to solve the problems caused by the transparent resin, a glass-sealed LED lamp has been proposed in which an LED chip is sealed with glass to meet the heat resistance, the light resistance and the impermeability to gases not provided for the transparent resin (See, e.g., JP-A-2006-253336 and JP-A-2002-203989).

In order to yield white light using the glass-sealed LED lamp, a method may be generally envisaged that phosphor powder is mixed into the glass as done in the transparent resin. In this case, it is desirable that the phosphor is uniformly dispersed so as to prevent unevenness in emission color of the LED lamp. However, since glass has a high viscosity even at a temperature (i.e., yielding point (At)) where it starts to be softened, it is exactly very difficult to uniformly disperse the phosphor therein. To have a low viscosity to uniformly disperse the phosphor in the glass, it is necessary to heat it to about 1000° C. However, at such a high temperature, the phosphor may be reacted with the glass so that the phosphor loses the fluorescence characteristic.

A method for uniformly dispersing the phosphor in glass is suggested in which glass powder and inorganic phosphor powder are mixed into a resin binder, a provisional molded piece with a desired shape is produce by press molding, the provisional molded piece is baked to remove the resin binder to form a phosphor-containing glass (See JP-A-2003-258308). However, in this method, the glass characteristic such as strength and transparency may deteriorate due to the remainder of the resin binder. Further, due to the vaporization of the remainder during the baking, air bubbles may be generated in the glass to allow gas permeability. Therefore, phosphors with low moisture resistance will be subject to deterioration in fluorescence characteristic.

Another method for yielding white light may be envisaged in which phosphor powder is mixed in a sol-gel glass precursor (e.g., solution of solvent:alcohol and solute:metal alkoxide) which can be formed at a relatively low temperature. However, since the sol-gel glass is porous and therefore has gas permeability, phosphors with low moisture resistance will be subject to deterioration in fluorescence characteristic. Further, since the sol-gel glass is large in volume change before and after the vitrification, it may cause cracks when it is formed into a thick film. Therefore, it is difficult to use it as a sealing material which is needed to be formed relatively thick.

SUMMARY OF THE INVENTION

It is an object of the invention to provide a method for making a light emitting device that is excellent in heat resistance, light resistance and gas impermeability while preventing the deterioration of phosphor with low moisture resistance.

(1) According to one embodiment of the invention, a method of making a light emitting device comprises:

mixing a glass powder with a phosphor powder including at least one of a sulfide phosphor, an aluminate phosphor and a silicate phosphor to produce a mixed powder in which the phosphor powder is dispersed in the glass powder;

heating and softening the mixed powder to provide an integrated material, and subsequently solidifying the integrated material to provide a phosphor-dispersed glass; and fusion-bonding the phosphor-dispersed glass onto a mounting portion on which a light emitting element is mounted by hot pressing, and simultaneously sealing the light emitting element with the phosphor-dispersed glass on the mounting portion.

In the light emitting device made by the above method, the sulfide phosphor, aluminate phosphor and silicate phosphor with low moisture resistance are contained in glass with gas impermeability. Therefore, deterioration in characteristic of the phosphor can be prevented. These phosphors have sufficient heat resistance against temperature where the powder glass is integrated by heating and softening, so that deterioration in characteristic of the phosphor is not caused during heating and softening. Further, since the light emitting element is sealed with the glass with the phosphor uniformly dispersed therein, unevenness in emission color of mixed light of light emitted from the light emitting element and wavelength-converted light radiated from the phosphor(s) is unlikely to occur.

(2) According to another embodiment of the invention, a method of making a method of making a phosphor containing glass plate comprises:

mixing a glass powder with a phosphor powder including at least one of a sulfide phosphor, an aluminate phosphor and a silicate phosphor to produce a mixed powder in which the phosphor powder is dispersed in the glass powder;

heating and softening the mixed powder to provide an integrated material, and subsequently solidifying the integrated material to provide a phosphor-dispersed glass; and processing the phosphor-dispersed glass into a plate.

By the above method, the phosphor containing glass plate can be obtained in which the phosphor(s) are uniformly dispersed without losing the fluorescence characteristic thereof.

In the above embodiment (1) or (2), the following modifications, changes and a combination thereof can be made.

(i) The mixed powder is heated to provide the integrated material while applying a pressure thereto.

(ii) The light emitting element includes a plurality of light emitting elements, and the method further comprises dividing the plurality of light emitting elements sealed with the phosphor-dispersed glass on the mounting portion into a plurality of light emitting devices.

(iii) The method further comprises forming a phosphor layer including a phosphor different from the phosphor powder on a surface of the phosphor-dispersed glass after sealing the light emitting elements or dividing the plurality of light emitting elements.

(iv) The method further comprises processing the phosphor-dispersed glass into a plate, wherein the plate phosphor-dispersed glass is fusion-bonded onto the mounting portion.

BRIEF DESCRIPTION OF THE DRAWINGS

The preferred embodiments according to the invention will be explained below referring to the drawings, wherein:

FIG. 2 is a cross sectional view showing an LED chip used in the embodiment;

FIGS. 3A and 3B are top views showing an electrode formation surface of the LE chip;

DETAILED DESCRIPTION OF THE PREFERRED EMBODIMENTS

Figure 1A:
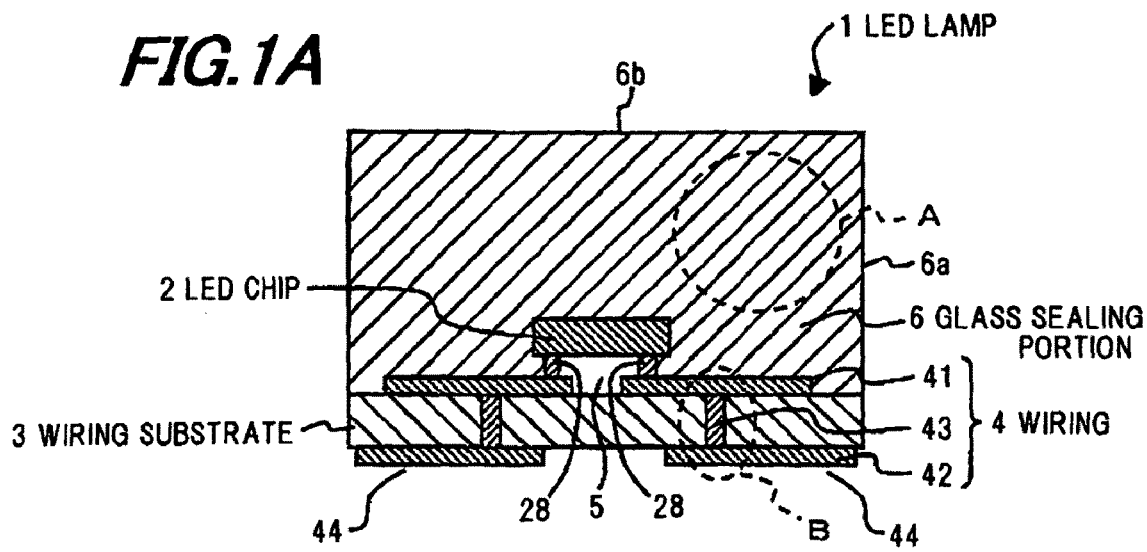
FIG. 1A is a cross sectional view showing an LED lamp in a preferred embodiment according to the invention.

FIG. 1A to 7 show the preferred embodiment of the invention. FIGS. 1A to 1C are cross sectional views showing an LED lamp in the embodiment. FIG. 2 is a cross sectional view showing an LED chip used in the embodiment.

As shown in FIG. 1A, the LED lamp (=light emitting device) 1 is composed of a flip-chip type LED chip (=light emitting element) 2, a wiring substrate 3 for mounting the LED chip 2 thereon, a wiring 4 formed on or in the wiring substrate 3, and a glass sealing portion 6 sealing the LED chip 2, adhered to the wiring substrate 3 and containing a phosphor 7 therein.

As shown in FIG. 2, the LED chip 2 is composed of, grown sequentially on the surface of a crystal growth substrate 20, a buffer layer 21, an n-type layer 22, a light emitting layer 23 and a p-type layer 24 which are of gallium nitride-based semiconductor ($Al_{1-X-Y}In_XGa_YN$, $0 \leq X \leq 1$, $0 \leq Y \leq 1$, $0 \leq X+Y \leq 1$), and formed by MOVPE (metalorganic vapor phase epitaxy). The LED chip 2 is epitaxially grown at 700° C. or more, and it has a heatproof temperature at 600° C. or more and heat resistance of 500° C. or more which corresponds to a process temperature during the sealing process using low-melting-point glass.

Electrodes for the LED chip 2 include a p-side electrode 25 formed almost the entire surface of the p-type layer 24, a p-side pad electrode 26 formed on a part of the p-side electrode 25, and a n-side electrode 27 formed on the n-type layer 22 as a bottom exposed by dry-etching partially the p-type layer 24 through the n-type layer 22 in a predetermined region of the LED chip 2. Au bumps 28 are each formed on the p-side pad electrode 26 and the n-side electrode 27.

The crystal growth substrate 20 is formed of sapphire ($Al_2O_3$), spinel ($MgAl_2O_4$), gallium nitride (GaN), silicon carbide (SiC), gallium oxide ($Ga_2O_3$) etc.

The p-side electrode 25 is formed of ITO (indium-tin-oxide) with a thermal expansion coefficient equal to the p-type layer 24. ITO has a thermal expansion coefficient equal to the thermal expansion coefficient ($5 \times 10^{-6}/°$ C.) of the gallium nitride semiconductor, so that it can prevent the peeling from the LED chip 2 caused by the difference in thermal expansion coefficient from the LED chip 2. A follow portion 5 (refractive index: about 1.0) where glass is not filled is formed between the LED chip 2 and the wiring substrate 3. Thus, even when ITO (refractive index: about 2.0) as a transparent conductive material is used, the refractive index difference from the follow portion 5 contacting the ITO is big to have a critical angle. Therefore, light emitted from the light emitting layer 23 is reflected toward the crystal growth substrate 20 at the interface of the hollow portion 5 and the ITO.

Figure 4A:
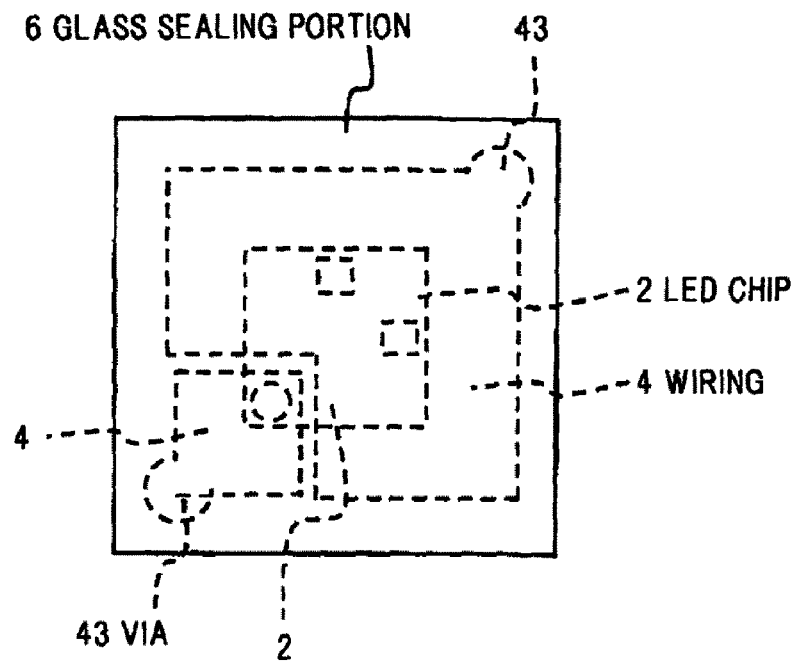
FIGS. 4A and 4B are top views showing a wiring formation on the wiring substrate used in the embodiment.
Figure 4B:
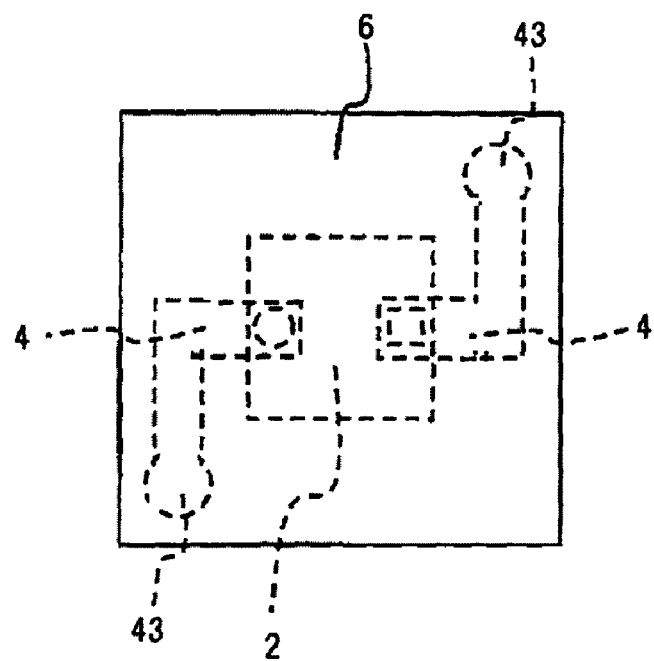

The n-side electrode 27 is formed of vanadium (V)/aluminum (Al)/gold (Au). The n-side electrode 27 may be disposed at the corner of the LED chip 2 as shown in FIGS. 3A and 4A, or at the middle of a side as shown in FIGS. 3B and 4B.

The LED chip 2 has a thermal expansion coefficient ($\alpha$) equal to that ($\alpha$) of the crystal growth substrate which occupies most part in thickness of the device. For example, when a sapphire substrate is used as the crystal growth substrate, although the GaN layer of the LED chip 2 has a thermal expansion coefficient of $5\times10^{-6}/°$ C., the whole LED chip 2 becomes to have a thermal expansion coefficient of $7\times10^{-6}/°$ C. which is equal to that of the sapphire substrate.

The wiring substrate 3 is formed of ceramics such as alumina ($Al_2O_3$), and formed 0.25 mm thick and 1.0 mm square. The alumina has a thermal expansion coefficient ($\alpha$) of $7\times10^{-6}/°$ C. which is the same as that of the LED chip 2.

Figure 1B:
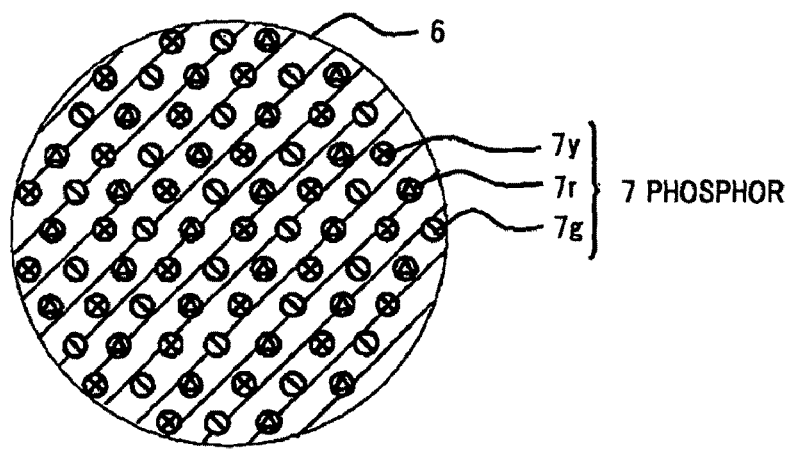
FIG. 1B is an enlarged cross sectional view showing a part A (glass-sealed portion) in FIG. 1A.
Figure 1C:
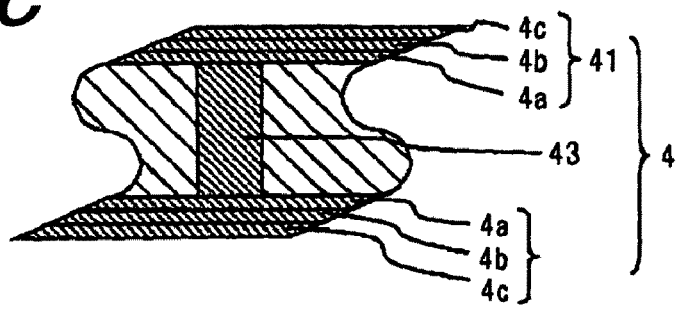
FIG. 1C is an enlarged cross sectional view showing a part B (wiring substrate) in FIG. 1A.

As shown in FIGS. 1A and 1C, the wiring 4 of the wiring substrate 3 is composed of a surface wiring 41 formed on the surface of the substrate and electrically connected to the LED chip 2, and a backside wiring 42 formed on the back side of the substrate and ready to be connected to an external terminal. The surface wiring 41 and the backside wiring 42 are each formed of tungsten (W)/nickel (Ni)/gold (Au) and patterned according to the form of the electrode of the LED chip 2. The surface wiring 41 and the backside wiring 42 are electrically connected by vias 43 of W penetrating the wiring substrate 3 in the thickness direction. The vias 43 are diagonally (top view) disposed on the wiring substrate 3.

As shown in FIG. 1B, the glass sealing portion 6 is formed of a $ZnO-B_2O_3-SiO_2-Nb_2O_5-Na_2O-Li_2O$-based low-melting point glass (hereinafter called "low-melting point glass A"), and a phosphor 7 composed of a green phosphor 7g, a yellow phosphor 7y and a red phosphor 7r is uniformly dispersed therein. Although FIG. 1B shows enlarging the section of a part A in FIG. 1A, the phosphor 7 is uniformly dispersed in all regions of the glass sealing portion 6. The green phosphor 7g and the red phosphor 7r are formed of sulfide phosphor, aluminate phosphor or silicate phosphor. The yellow phosphor 7r is formed of, e.g., YAG (yttrium aluminum garnet, $Y_3Al_5O_{12}:Ce^{3+}$)-based phosphor.

The sulfide phosphor is a phosphor which contains sulfur in the matrix of the phosphor. For example, the following phosphors may be included.
$(AE)Ga_2S_4:Eu^{2+}$ green phosphor
$(AE)S:Eu^{2+}$ red phosphor
where AE represents at least one of Ca and Sr.

The aluminate phosphor is a phosphor which contains $Al_2O_3$ as the matrix of the phosphor. For example, the following phosphors may be included.
$(AE)M_2O_4:Eu^{2+}$ green phosphor
where AE represents at least one of Ca, Sr and Ba and M represents at least one of B, Al and Ga.

The silicate phosphor is a phosphor which contains $SiO_2$ as the matrix of the phosphor. For example, the following phosphors may be included.
$(AE)_3MO_5:EU^{2+}$ orange phosphor
where AE represents at least one of Ca, Sr and Ba and M represents at least one of Si and Ge.

As shown in FIG. 1A, the glass sealing portion 6 is formed rectangular solid on the wiring substrate 3 and 0.5 mm thick. A side 6a of the glass sealing portion 6 is formed by dicing a plate glass with the wiring substrate 3 bonded to thereto by hot pressing by using a dicer. A top surface 6b of the glass sealing portion 6 corresponds to one surface of the plate glass bonded to the wiring substrate 3 by hot pressing.

The low-melting glass is 490° C. in glass transition temperature (Tg), 520° C. in yielding point (At), where the glass transition temperature (Tg) is sufficiently lower than the temperature for forming the epitaxial layers of the LED chip 2. In the embodiment, the glass transition temperature (Tg) is by 200° C. or more lower than the formation temperature of the epitaxial layers. The low-melting glass has a thermal expansion coefficient ($\alpha$) of $6\times10^{-6}/°$ C. at 100° C. to 300° C. The thermal expansion coefficient ($\alpha$) becomes larger than this when it is beyond the glass transition temperature (Tg). Thereby, the low-melting glass can be bonded to the wiring substrate 3 at about 600° C. by hot pressing. The low-melting glass of the glass sealing portion 6 is 1.7 in refractive index.

The composition of the low-melting glass is arbitrary if the glass transition temperature (Tg) is lower than the heatproof temperature of the LED chip 2 and the thermal expansion coefficient ($\alpha$) is the same as the wiring substrate 3. A glass material with a relatively low glass transition temperature (Tg) and a relatively small thermal expansion coefficient ($\alpha$) includes $ZnO-SiO_2-R_2O$-based glass (where R represents at least one of alkali metal elements of Li, Na, K etc.), phosphate-based glass, and lead glass. Of these glasses, the $ZnO-SiO_2-R_2O$-based glass is preferable since it is in moisture resistance better than the phosphate-based glass and it has no environmental load material as in the lead glass.

The low-melting glass is generally processed at a viscosity remarkably higher than a high viscosity level in resins. Further, the viscosity of glasses does not lower to the general viscosity level of resin sealing even when temperature rises by tens of degrees from the yielding point. If it is reduced to the general viscosity level of resin sealing, the temperature needs to be elevated to beyond the crystal growth temperature of LED chip, or the glass may be adhered to the mold, whereby the process of sealing or molding becomes difficult to conduct. Because of this, the glass is preferably processed at $10^4$ poise or more.

The yielding point and thermal expansion coefficient of glass are correlative to each other since the factor of glass bonding force functions. In general, the lower the yielding point is, the bigger the thermal expansion coefficient becomes. Thus, the low-melting glass has a big thermal expansion coefficient. In order to render the thermal expansion coefficient ($\alpha$) of glass equal to the thermal expansion coefficient ($\alpha$=5 ppm/° C. to 10 ppm/° C.) of ceramic substrate, the yielding point needs to be 450° C. or more. In order to have such a viscosity that glass can be uniformly dispersed, temperature needs to be 1000° C. or more, where the phosphor loses the fluorescence characteristic thereof. In addition, according as glass lowers in viscosity at high temperature, i.e., at a temperature of not in glass state but being possible in solid state (crystal state), it is likely to be clouded by crystallization. In the invention, the glass and the phosphor are powdered and the glass is uniformly dispersed while being softened at a high viscosity and a temperature within 200° C. from the yielding point. Therefore, the phosphor does not lose the fluorescence characteristic thereof and the glass is not clouded by crystallization.

The phosphor is formed of the yellow phosphor 7y, the red phosphor 7r and the green phosphor 7g. In the embodiment, a YAG-based phosphor is used as the yellow phosphor 7y, an sulfide phosphor, aluminate phosphor or silicate phosphor is used as the red phosphor 7r and the green phosphor 7g. Alternatively, only one of the red phosphor 7r and the green phosphor 7g may be used.

Figure 5:
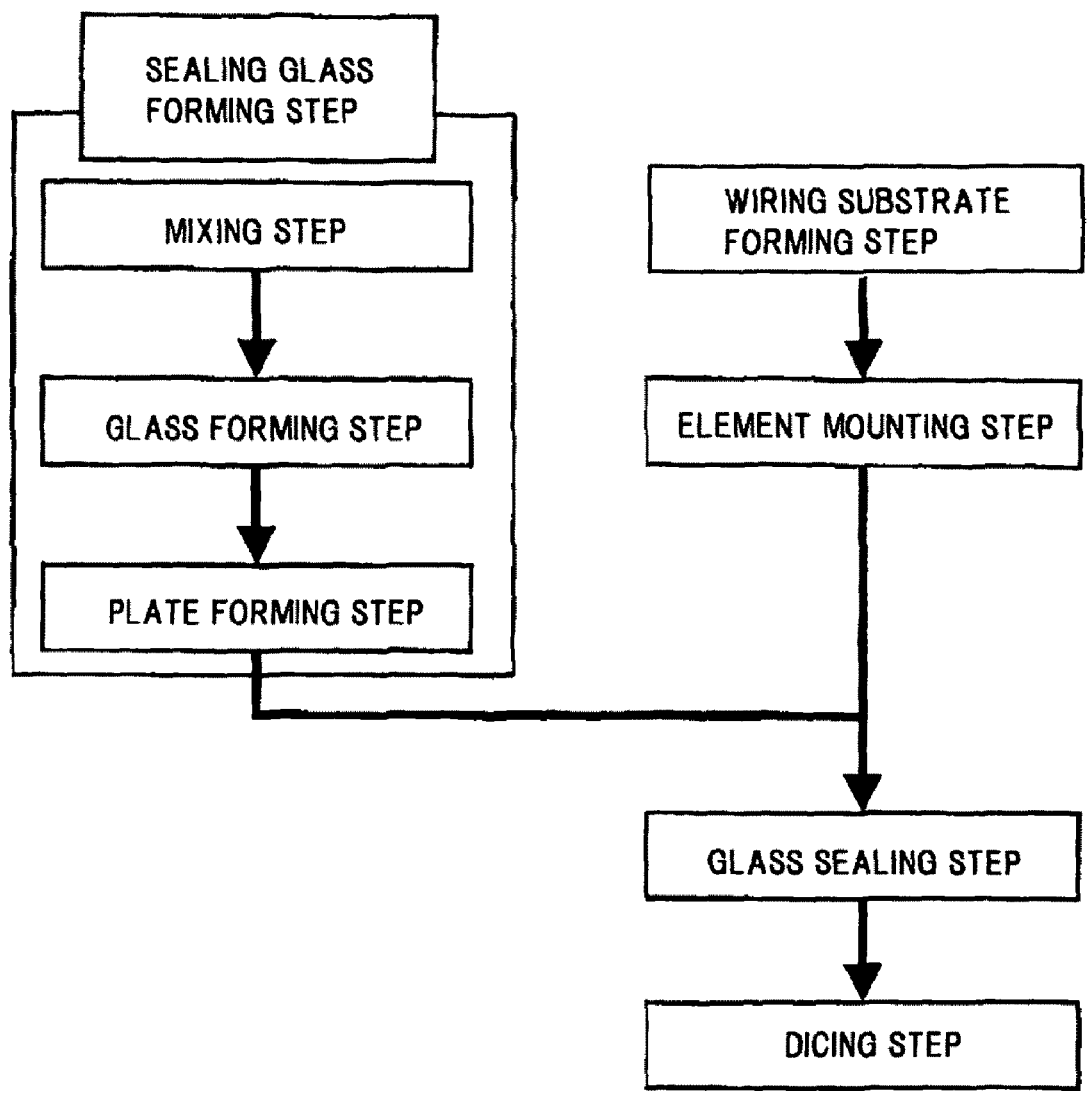
FIG. 5 is a flow chart showing a method of making the LED lamp in the embodiment.

A method of making the LED lamp 1 will be described below referring to the flow chart of FIG. 5.

First, the low-melting glass A is pulverized and classified by a sieve so as to produce glass powder which is 20 μm in minimum particle size, 60 μm in maximum particle size, and 30 μm in average particle size. The production method of the glass powder is described later. The glass powder is mixed at a predetermined ratio with the phosphor powders 7r, 7y and 7g which are 10 μm in average particle size. Thus, mixed powder 10 is produced in which the phosphor powders 7r, 7y and 7g are uniformly dispersed in the glass powder. At this stage, a light diffusing powder with an average particle size of 20 μm may be added at a predetermined ratio such that it is uniformly dispersed in the glass powder as well as the phosphor powders 7r, 7y and 7g. The light diffusing powder material can be zirconia ($ZrO_2$), alumina ($Al_2O_3$), silica ($SiO_2$) etc. By adding the light diffusing powder, the light diffusion property inside the glass sealing portion 6 of the LED lamp 1 can be enhanced so that the mixing of light emitted from the LED chip 2 and light from the phosphor 7 can be improved to further prevent unevenness in emission color of the LED lamp 1.

Figure 6A:
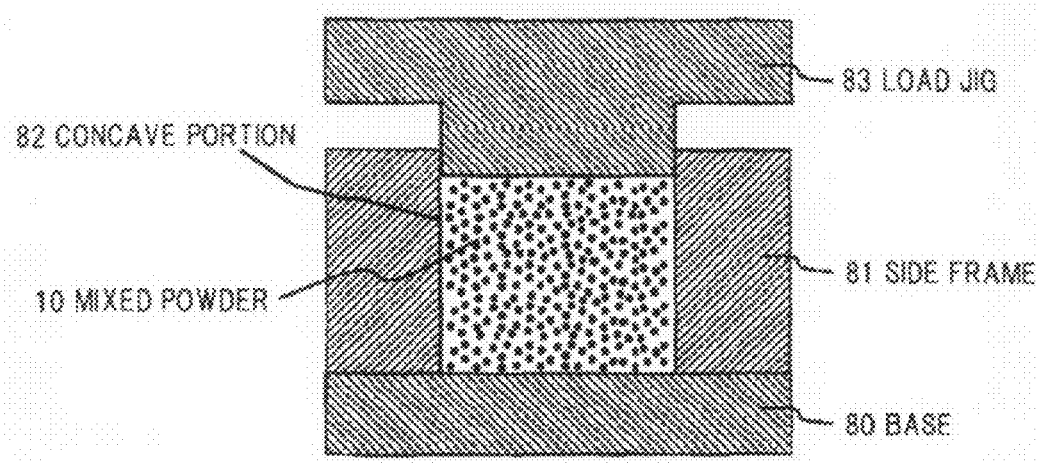
FIG. 6A is a cross sectional view showing a processing apparatus for producing phosphor-dispersed glass from a mixed powder.
Figure 6B:
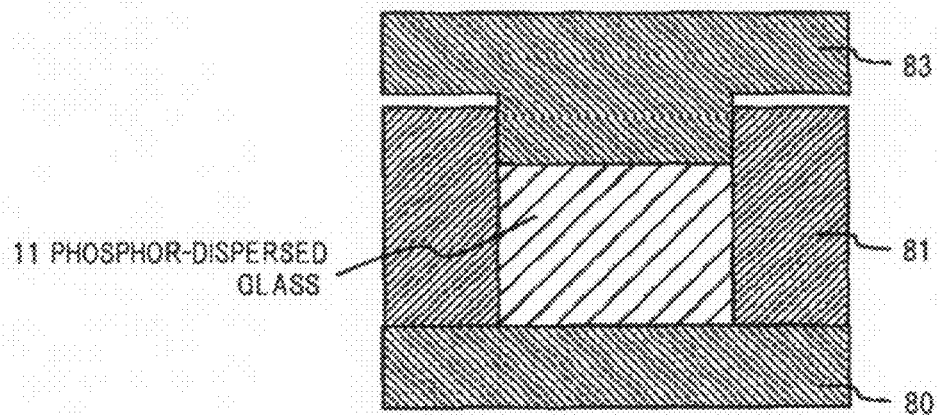
FIG. 6B is a side view showing the phosphor-dispersed glass produced from the mixed powder.
Figure 6C:
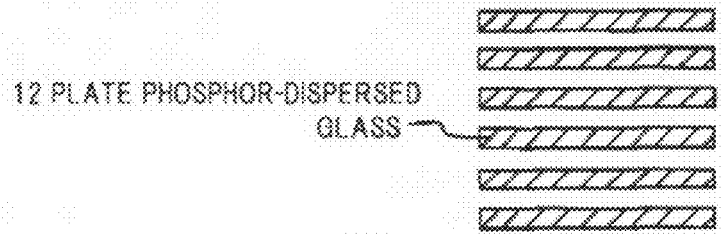
FIG. 6C is a side view showing plates obtained by slicing the phosphor-dispersed glass in FIG. 6B.

FIGS. 6A to 6C illustrate the production process and states of phosphor-dispersed glass. FIG. 6A is a cross sectional view showing a processing apparatus for producing phosphor-dispersed glass from the mixed powder. FIG. 6B is a side view showing the phosphor-dispersed glass produced from the mixed powder. FIG. 6C is a side view showing plates obtained by slicing the phosphor-dispersed glass in FIG. 6B to have a uniform thickness.

First, the mixed powder 10 produced by mixing the glass powder and the phosphor powder is melted while a load is applied thereto. The mixed powder 10 is solidified to produce the phosphor-dispersed glass 11.

For example, as shown in FIG. 6A, on a flat top surface of a base 80, a tubular side frame 81 is disposed surrounding a predetermined region of the base 80 such that a concave portion 82 is formed to be opened upward. The concave portion 82 provides the same section in the vertical direction such that a lower part of a load jig 83 shaped in accordance with the section form of the concave portion 82 can be vertically moved in the concave portion 82. After the mixed powder 10 is put in the concave portion 82, the load jig 83 for pressing inside the concave portion 82 is placed in the concave portion 82. Then, reducing the atmosphere pressure to 7.6 Torr and heating to 650° C., a pressure of 20 kg/cm² is applied to the mixed powder 10 by the load jig 83 to soften the glass. Meanwhile, the glass softening conditions may be at normal pressure and without applying pressure. Thus, the glass is preferably softened at a temperature within 200° C. from the yielding point (At). If the glass is softened at a temperature beyond the above temperature, the glass is likely to be crystallized and clouded when it is solidified.

Then, the melted mixed powder 10 is cooled and solidified such that as shown in FIG. 6B, the phosphor-dispersed glass 11 with the phosphor 7 dispersed therein can be obtained without residual air bubbles with a size affecting in optical aspect or being clouded. Here, the residual air bubbles with a size affecting in optical aspect can be an air bubble with a diameter of 100 μm or more with respect to the 300 μm square LED chip 2. If such an air bubble exists near the LED chip 2, light emitted from the LED chip 2 may be inputted again into the LED chip 2 to reduce the light output efficiency.

Then, as shown in FIG. 6C, the phosphor-dispersed glass 11 thus produced is sliced into plates 12 in accordance with the thickness of the glass sealing portion 6 (Plate Forming Step). In this embodiment, the glass sealing portion 6 is 0.5 mm in thickness.

In this embodiment, no binder is used in producing the phosphor-dispersed glass 11. Therefore, as compared to the case that the mixed powder is baked using a resin binder, the glass property such as strength or transparency does not deteriorate the remainder of the binder. Further, the airtightness is impaired by air bubbles when the LED chip 2 is sealed.

The phosphor-dispersed glass 11 thus produced allows the phosphor 7 to be uniformly dispersed since the phosphor 7 powder is dispersed in the glass powder before melting. For example, the phosphor containing volume ratio is in the range of preferably 50 to 200%, more preferably 80 to 125% in relation to the overall mean, in an arbitrary volume of $\{10\times$ (phosphor average particle width)/(phosphor containing volume ratio)$^{1/3}\}\times 3$. The phosphor-dispersed glass 11 exactly obtained has the phosphor 7 containing volume ratio in the range of 80 to 125% at 9 areas obtained by trisecting it in arbitrary three orthogonal directions. Each area has more preferably the phosphor 7 containing volume ratio in the range of 90 to 112%. If necessary, by increasing the degree of glass pulverization to have the same size as the phosphor 7 particles, the uniform dispersion can be obtained at more microscopic area.

On the other hand, apart from the phosphor-dispersed glass 11, the wiring substrate 3 with the vias 3a formed therein is provided. A W paste is screen-printed on the surface of the wiring substrate 3 in accordance with the wiring pattern. Then, the wiring substrate 3 with the W paste printed thereon is heated at 1000° C. or so to bake the W onto the wiring substrate 3. Then, Ni plating and Au plating are sequentially formed on the W to form the wiring 4 (Wiring Substrate Forming Step). Meanwhile, the surface of the polycrystalline alumina substrate may be formed microscopically concave-convex due to the grain boundary of polycrystalline alumina by omitting the flattening step by polishing conducted for fining the wiring 4, or formed concave-convex by blast finishing.

Then, the plural LED chips 2 are electrically connected to the surface wiring 41 of the wiring 4 on the wiring substrate 3 by the Au bumps 28 (Element Mounting Step).

Figure 7:
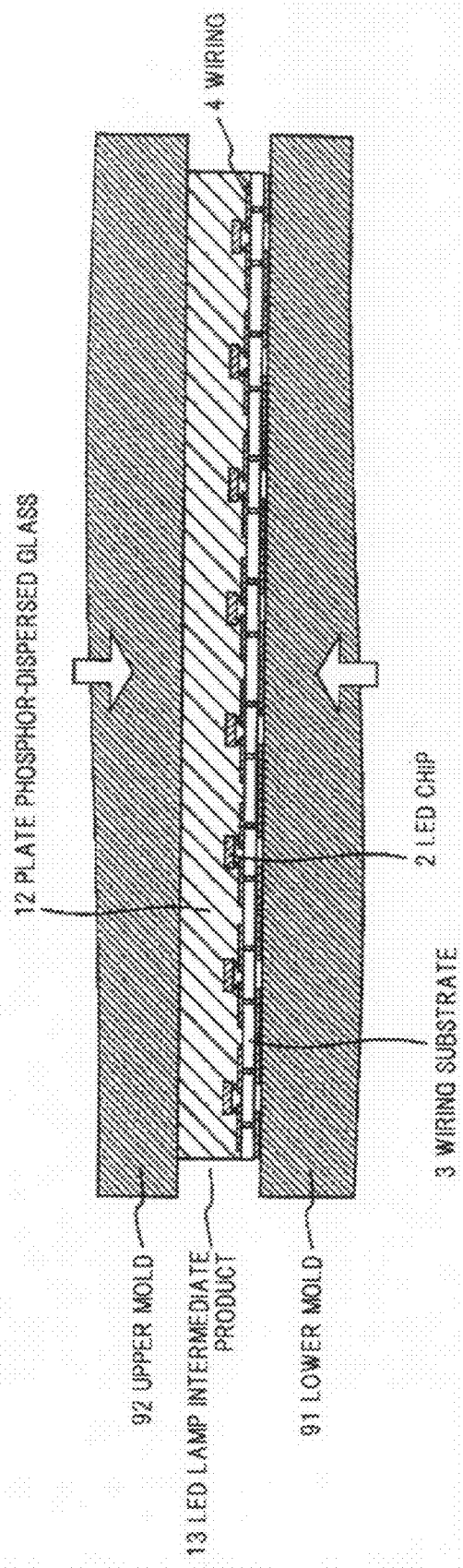
FIG. 7 is a cross sectional view illustrating a hot pressing process in the embodiment.

Then, the wiring substrate 3 with the LED chips 2 mounted thereon is placed on a lower mold 91 and the plate phosphor-dispersed glass 12 is placed on an upper mold 92. The lower mold 91 and the upper mold 92 are each equipped with a heater such that they can be temperature-controlled independently. Then, as shown in FIG. 7, the plate phosphor-dispersed glass 12 is stacked on the substantially flat mounting surface of the wiring substrate 3, and hot pressing is conducted pressing the lower mold 91 and the upper mold 92 as shown by arrows in FIG. 7. Thereby, the plate phosphor-dispersed glass 12 is fusion bonded to the wiring substrate 3 with the LED chips 2 mounted thereon, and the LED chips 2 on the wiring substrate 3 are sealed with the plate phosphor-dispersed glass 12 (Glass Sealing Step). FIG. 7 is a cross sectional view illustrating the hot pressing process. In this embodiment, the glass sealing step is conducted pressing in the range of 20 to 40 kgf/cm².

Thus, the plate phosphor-dispersed glass 12 is bonded to the wiring substrate 3 via oxides included therein. The viscosity of the low-melting glass during the hot pressing is preferably in the range of $10^5$ to $10^7$ poise. The viscosity range can prevent the adherence of glass to the upper mold and the outward flow of glass caused by low viscosity so as to improve the process yield or can prevent the reduction in adhesion of glass to the wiring substrate 3 and the increase in amount of crushed bumps 28 caused by high viscosity.

As described above, the surface of the wiring substrate 3 is roughened due to the polycrystalline alumina, so that the bonding interface of the glass sealing portion 6 can be roughened along the surface of the wiring substrate 3. This can be realized by applying pressure during the hot pressing and by processing under the reduced pressure atmosphere lower than the atmospheric pressure. Meanwhile, as far as glass can be got into the concave portions of the roughened polycrystalline alumina, the pressure condition during the hot pressing or the reduced pressure condition of the atmosphere can be arbitrarily selected. As a matter of course, only one of the pressure condition during the hot pressing or the reduced pressure condition of the atmosphere may be conducted. As a result, the anchor effect can be generated between the glass sealing portion 6 and the wiring substrate 3 so as to enhance the bonding strength therebetween.

In order to shorten the cycle time of the hot pressing, a preheating stage before pressing may be added for preheating the glass sealing portion 6 or a cooling stage after pressing may be added for controlling the cooling speed of the glass sealing portion 6. Alternatively, pressing can be conducted at the preheating stage and the cooling stage. Thus, the steps for hot pressing can be suitably changed.

By conducting the above steps, as shown in FIG. 7, an LED lamp intermediate product 13 is produced in which the plural LED lamps 1 are integrated lengthwise and crosswise. Then, the LED lamp intermediate product 13 (i.e., the wiring substrate 3 integrated with the glass sealing portion 6) is placed on a dicer and the LED chips 2 are diced into pieces so as to have the LED lamp 1 (Dicing Step). Since the glass sealing portion 6 and the wiring substrate 3 are cut together by the dicer, the side face of the wiring substrate 3 and the glass sealing portion 6 can be flush with each other.

Figure 8:
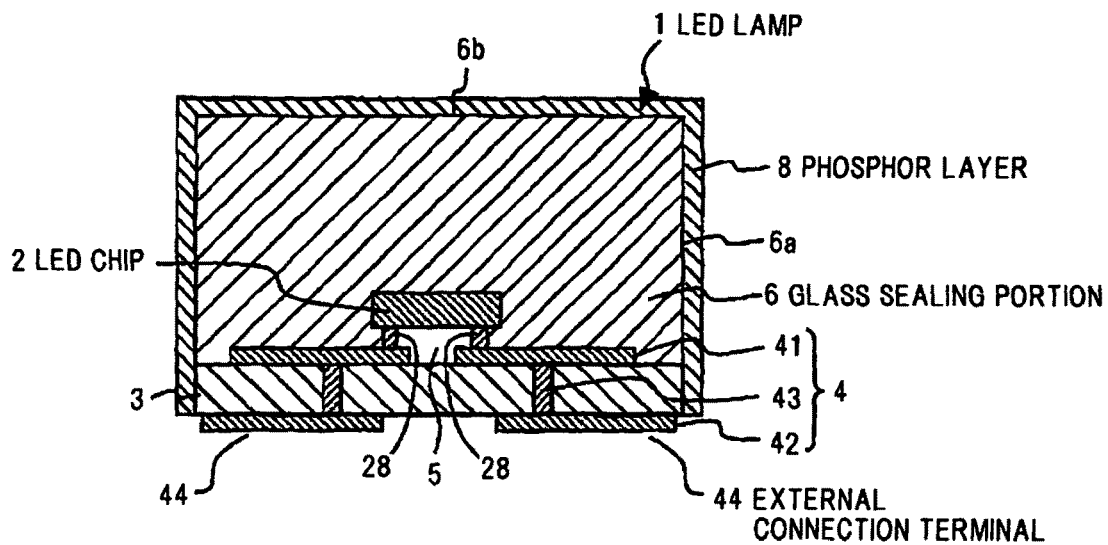
FIG. 8 is a cross sectional view showing an LED lamp as a modification in the embodiment.
Figure 9:
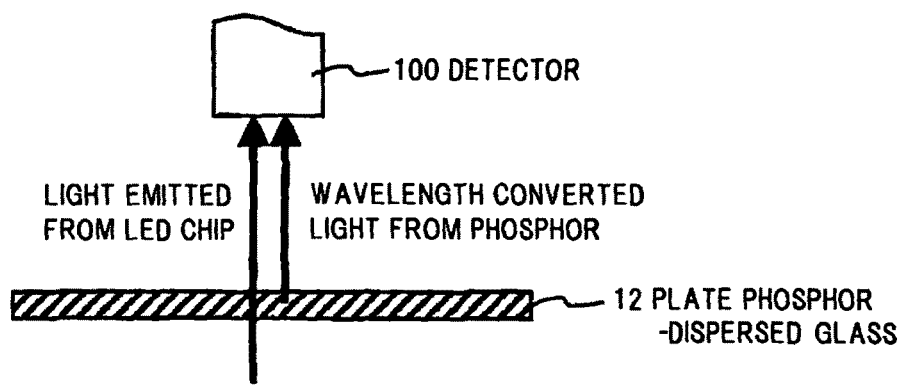
FIG. 9 is an explanatory diagram illustrating an experimental method for checking the effect of the embodiment.

In modification, as shown in FIG. 8, a phosphor layer 8 of a sol-gel glass or silicone resin with phosphor included therein may be formed on a part except the surface for disposing an external connection terminal 44 of the LED lamp 1. In this case, the phosphor can be BOS (barium orthosilicate, $Ba_2SiO_4$)-system phosphors such that the color rendering property of the LED lamp 1 can be improved. In case of forming the above phosphor layer, the yellow phosphor 7y may not be mixed in the low-melting glass.

In the LED lamp 1 produced as described above, when current is fed through the wiring 4 to the LED chip 2, blue light is emitted from the LED chip 2. A part of blue light emitted from the LED chip 2 is converted into red, green and yellow lights by the phosphor 7 in the glass sealing portion 6. These lights are mixed such that white light is radiated from the LED lamp 1.

Since the phosphor 7 is uniformly dispersed in the glass sealing portion 6, light emitted from the LED chip 2 can be uniformly wavelength-converted regardless of the emission angles so that unevenness in emission color is not caused in light radiated outward.

Since the incidence of air bubbles is suppressed in the glass sealing portion 6, light cannot be scattered in the glass sealing portion 6 so that the light extraction efficiency can be secured. Also, the airtightness of the LED chip 2 cannot be impaired by the air bubbles.

It is desirable that the glass particle size in the mixed powder 10 is in the range of several micrometers to 200 μm so as to avoid the impurity contamination or physical damage during the pulverization, to suppress the incidence of residual air bubbles during the glass melting step, and to disperse uniformly the phosphor 7 in the glass. This can prevented the phosphor 7 from not being in a continuous area with a diameter of 300 μm or more.

In the embodiment, since the mixed powder 10 is melted applying a load, the powder can be melted at a temperature lower than that without applying the load. Further, since the processing can be conducted near at the yielding point (At), the crystallization can be prevented even when unstable ZnO-based glass is used. Meanwhile, the phosphor 7 can be uniformly dispersed even when the glass is melted without applying the load, or the glass may be melted applying a high pressure such as 50 kgf/cm² by using a press machine. The level of the reduced pressure atmosphere or the pressure applied can be suitably changed according to the characteristic of glass. The reduced pressure atmosphere and the pressure applied to glass are not always necessary to use together. As a matter of course, the glass may be melted under one condition of the reduced pressure atmosphere and the pressure applied to glass.

Since the low-melting glass A is used as the glass sealing portion 6, the glass sealing portion 6 can be excellent in stability and weather resistance. Thus, even when the LED lamp 1 is used under a severe environment for a long period, the glass sealing portion 6 can be prevented from deterioration and reduction in the light extraction efficiency with time can be effectively suppressed. Further, since the glass sealing portion 6 is high in refractive index and in light transmission characteristic, both high reliability and high light output efficiency can be obtained.

However, even when the low-melting glass A is used, it is noted that a predetermined conversion efficiency of the phosphor is not always obtained. Therefore, the inventors conduct the following experiments in order to investigate the cause.

Glass powder samples of classified low-melting glass A are prepared by three methods below.

First, the low-melting glass A is prepared by blending glass powders with various compositions as raw materials.

Then, Sample 1 is prepared by the following steps. First, the blended glass powder is melted and then solidified in the air. Then, the solidified glass is pulverized in the air by using a ball mill to be about 100 μm in maximum particle size to make glass powder. Then, by using a 60 μm mesh sieve and a 20 μm mesh sieve, the glass powder is classified to be 60 μm in maximum particle diameter and 20 μm in minimum particle diameter.

Samples 2 and 3 are prepared such that the blended glass powder is melted and the melted glass is dropped into a water bath at normal temperature such that crushed glass powder is produced by thermal shock. Then, the glass powder with water is pulverized by a ball mill, and a mixture of glass powder with a particle diameter of 60 μm or less and water are produced by using a sieve. Then, apart from the water bath, a classification water bath filled with water is provided. The mixture of the glass powder and the water is put into the classification water bath, where supernatant fine glass powder is removed and the residual glass powder is classified by a sieve. By this way, glass powder less than 20 μm is included in the supernatant solution, the glass powder is classified to be 60 μm in maximum particle diameter and 20 μm in minimum particle diameter.

Then, Sample 2 is dried at 100° C. for 2 hours, Sample 3 is dried 100° C. for 24 hours for completely remove moisture from the glass powder.

Then, Samples 1 to 3 are each mixed with (Sr, Ca)S:$Eu^{2+}$ phosphor powder such that the phosphor powder is 10 wt % of the total weight of the mixed powder. Then, the glass is softened to produce three kinds of 0.7 mm thick plate phosphor-dispersed glass 12.

Then, the three kinds of phosphor-dispersed glass 12 are irradiated with a blue light (with a peak wavelength of 450 nm) from a light source such that the (Sr, Ca)S:$Eu^{2+}$ phosphor is thereby excited to radiate a wavelength-converted light (with a peak wavelength of 650 nm). Based on values of light output from the light source and light output at peak wavelength of the wavelength-converted light detected by a light output detector 100, the wavelength conversion efficiency of the phosphor in each plate phosphor-dispersed glass 12 is determined as shown in Table 1.

TABLE 1

| | Powder glass sample used in phosphor-dispersed glass | | |
|---|---|---|---|
| | Sample 1 | Sample 2 | Sample 3 |
| Wavelength conversion efficiency | 5.53% | 6.56% | 7.57% |

As shown in Table 1, it is proved that wavelength conversion efficiency in case of using Samples 2 and 3 prepared by the wet type classification can be higher than that in case of using Sample 1 prepared by the dry type classification for forming the plate phosphor-dispersed glass 12. The reason is assumed because in the dry type classification the glass powder can be easy charged with static electricity whereby impurity can be attached to the surface.

Further, in view of the results of the plate phosphor-dispersed glass 12 produced by using Samples 2 and 3, it is proved that sufficient (long-time) drying of samples in the wet type classification allows an increase in wavelength conversion efficiency. Therefore, when the plate phosphor-dispersed glass 12 is produced, the glass powder as a raw material is desirably prepared by the wet type classification. In addition, in case of using the wet type classification, it is desirable that moisture is completely removed from the glass powder.

The glass sealing portion 6 is formed of glass having a yielding point (At) lower than the epitaxial growth temperature of semiconductor layers of the LED chip 2. Therefore, the LED chip 2 is not subjected to thermal damage during the hot pressing and can be processed at temperature sufficiently low as compared to the crystal growth temperature of the semiconductor layers. Further, the plate low-melting glass is placed parallel to the wiring substrate 3 and is hot pressed at a high viscosity. Thereby, the low-melting glass is parallel moved and surface-bonded to the surface of the wiring substrate 3 to seal the GaN-based LED chip 2. Therefore, the incidence of void can be prevented.

Since the wiring substrate 3 and the glass sealing portion 6 are bonded each other through oxide chemical bonding, the sealing strength can be further enhanced. This allows the practical application of a small package with a small bonding area.

The wiring substrate 3 and the glass sealing portion 6 are nearly equal in thermal expansion coefficient ($\alpha$) so that bonding failure such as peeling and cracking is not liable to occur even when being left at room temperature or low temperature after being bonded at high temperature. In addition, glass is liable to generate cracks by tensile stress but not to liable to generate cracks by compressive stress. Therefore, the glass sealing portion 6 is rendered slightly smaller in thermal expansion coefficient ($\alpha$) than the wiring substrate 3.

In general, glasses have the property that thermal expansion coefficient ($\alpha$) thereof increases at temperature beyond its glass transition temperature (Tg). Thus, when the glass sealing is conducted at temperature higher than Tg, it is preferable to take into account a thermal expansion coefficient ($\alpha$) at temperature higher than Tg as well as that at temperature lower than Tg so as to conduct the stable glass sealing. In other words, by allowing a glass material composing the glass sealing portion 6 to have thermal expansion coefficient ($\alpha$) nearly equal to thermal expansion coefficient ($\alpha$) at temperature higher than Tg as well as that of the wiring substrate 3, internal stress causing warpage of the wiring substrate 3 can be reduced. Therefore, shear failure in glass can be prevented that may arise although the bonding strength can be secured between the wiring substrate 3 and the glass sealing portion 6.

Thus, the wiring substrate 3 and the glass sealing portion 6 can be enlarged in size so that the number of LED lamps producible together can be increased to allow high productivity.

It is confirmed by the inventors that the peeling or cracking does not occur after 1000 cycles of wet thermal shock test in the range of −40° C. to 100° C. Further, it is confirmed that, where, for combinations of glass and ceramic substrate with different thermal expansion coefficients, the test is conducted that a 5 mm×5 mm glass piece is bonded to a ceramic substrate, if the ratio of one material (of the glass and the ceramic substrate) with a lower thermal expansion coefficient to the other material with a lower thermal expansion coefficient is 0.85 or more, they can be bonded to each other without cracks. Being nearly equal in thermal expansion coefficient can be defined as this ratio range (0.85 or more), although it depends on the rigidity or size of material.

Further, in order to confirm the effect of the LED lamps in the embodiment, the inventors have conducted an accelerated deterioration test as below. FIGS. 10A to 10D are graphs showing the results of the accelerated deterioration test.

Figure 10A:
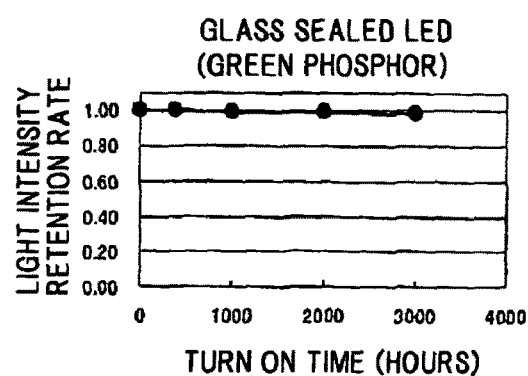
FIGS. 10A to 10D are graphs showing the measurement results of a high temperature and high humidity test on the glass-sealed LED lamps of the embodiment and conventional resin-sealed LED lamps, where FIG. 10A relates to a green phosphor containing LED lamp of the invention, FIG. 10B relates to a red phosphor containing LED lamp of the invention, FIG. 10C relates to a conventional green phosphor containing LED lamp, and FIG. 10D relates to a conventional red phosphor containing LED lamp.
Figure 10C:
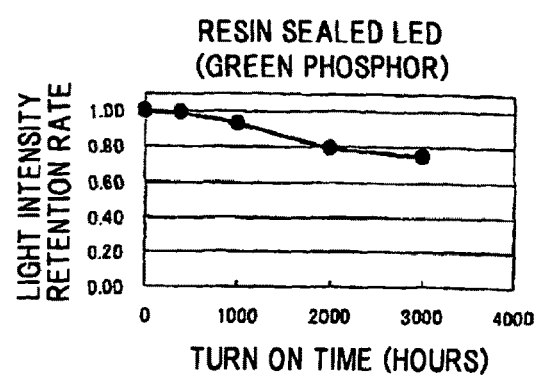
Figure 10B:
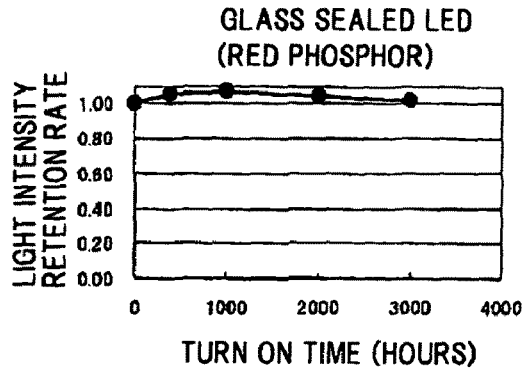
Figure 10D:
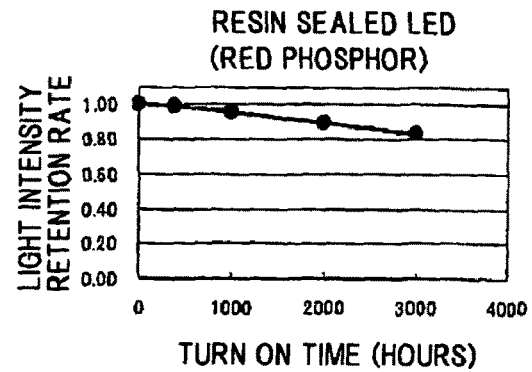

The test samples are the LED lamp of the embodiment and a silicone resin sealed LED lamp, each of which a red phosphor (i.e., sulfide phosphor ($CaS:Eu^{2+}$)) or a green phosphor (i.e., sulfide phosphor ($CaGa_2S_4:Eu^{2+}$)) is added. The test is conducted such that the LED chip of the sample LED lamps is applied 20 mA current under high temperature and high humidity of 60° C. and 90% humidity, and retention rate in light intensity of emitted light of the LED lamp is measured. As shown in FIGS. 10A and 10B, in the LED lamps of the embodiment, the light intensity of emitted light is retained even after 3000 hours in current applying time. However, as shown in FIGS. 10C and 10D, in the conventional LED lamps, for all the phosphors, the light intensity of emitted light lowers significantly before 1000 hours in current applying time.

Since the LED chip 2 is flip-mounted without using any wires, no problem occurs at electrodes thereof even when pressing the glass at high viscosity. The viscosity of the low-melting glass during the sealing step is as high as $10^4$ to $10^8$ poises, which is in physical property very different from epoxy resins that is in liquid phase at a viscosity of about 5 poises before being thermally hardened. Therefore, when sealing with the glass a face-up type LED chip that uses wires for electrically connecting electrodes formed on its surface to a power feeding member such as a lead, the wires may be crushed or deformed. However, the LED chip 2 of this embodiment can avoid this problem. On the other hand, when sealing a flip-chip type LED chip which is flip-mounted on a power feeding member such as a lead through Au bumps or so, crush of the bumps or shortening between the bumps may be caused by pressure applied to the LED chip due to the high viscosity of glass. However, the LED chip 2 of this embodiment can also avoid this problem.

The surface wiring 41 of the wiring substrate 3 is drawn to the backside wiring 42 through the via 43. Therefore, the production process can be simplified without requiring special countermeasures against the problems that the glass material penetrates into unnecessary sites and that the electrical terminal is covered with the glass material. Further, since the plural LED chips 2 are simultaneously sealed by the plate phosphor-dispersed glass 12, the plural LED lamps 1 can be easily mass-produced by dicing. Meanwhile, since the low-melting glass is processed at high viscosity, the mass-production can be sufficiently achieved if only the external terminals are drawn to the back surface even without using the via holes, where the countermeasures required for the resin sealing against the outward flow of the sealing material are not necessary.

The LED chips 2 are flip-chip mounted, so that the ultra-small LED lamp 1 such as 0.5 mm square can be realized as well as solving the problems in conducting the glass sealing process. This is because the boding space for wires is not needed and no peeling at the interface occurs even at a small bonding space since the glass sealing portion 6 and the wiring substrate 3 have substantially the same thermal expansion coefficients and are securely bonded based on the chemical bonding.

The LED chip 2 and the glass sealing portion 6 have substantially the same thermal expansion coefficients. Thus, since all the adjacent members including the wiring substrate 3 have substantially the same thermal expansion coefficients, the internal stress caused can be very low even in the temperature difference between high temperature during the glass sealing process and room temperature, so that stable workability can be obtained without generating cracks. Further, the internal stress can be thus reduced to enhance the impact resistance, so that the glass sealing type LED with high reliability can be obtained.

The wiring substrate 3 is formed of alumina ($Al_2O_3$), so that the parts cost can be reduced, and the reduction in device cost can be realized as well as the mass productivity since it is readily available. Further, $Al_2O_3$ has a good thermal conductivity, so that it can be sufficiently adapted to high brightness or high output type devices. Furthermore, since the wiring substrate 3 has a small light absorption, it is optically advantageous.

Although in the embodiment, the LED lamp 1 uses the LED chip 2 made of a GaN based semiconductor material, the LED element is not limited to the GaN based LED chip 2, and may be made of another semiconductor material such as ZnSe based and SiC based semiconductor materials.

The LED chip 2 may be produced by scribing. In this case, the LED chip 2 produced by scribing may have on a side surface thereof, as a cut section, a sharpened concavity and convexity, and the side surface of the LED chip 2 is preferably coated by a chip coating material. The chip coating material includes $SiO_2$ based coating material with optical transparency. The chip coating material can prevent the occurrence of cracks and voids in case of overmolding etc.

The glass sealing portion 6 of this embodiment may deteriorate when dew condensation generates depending on the use conditions of the device although it is excellent in weather resistance as described earlier. Even in this case, although the device is desirably composed so as not to have the dew condensation, the glass sealing portion 6 can be prevented from deteriorating due to the dew condensation at high temperature by coating a silicone resin etc. on the surface of the glass sealing portion 6. The coating material coated on the surface of the glass sealing portion 6 preferably includes an inorganic material such as a $SiO_2$ based material and $Al_2O_3$ based material which has not only humidity resistance but also acid resistance and alkali resistance.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method of making a light emitting device, comprising:
    mixing a glass powder with a phosphor powder including at least one of a sulfide phosphor, an aluminate phosphor and a silicate phosphor to produce a mixed powder in which the phosphor powder is dispersed in the glass powder;
    heating and softening the mixed powder to provide an integrated material, and subsequently solidifying the integrated material to provide a phosphor-dispersed glass; and
    fusion-bonding the phosphor-dispersed glass onto a mounting portion on which a light emitting element is mounted by hot pressing, and simultaneously sealing the light emitting element with the phosphor-dispersed glass on the mounting portion.

2. The method according to claim 1, wherein the mixed powder is heated to provide the integrated material while applying a pressure thereto.

3. The method according to claim 2, wherein the light emitting element includes a plurality of light emitting elements, and
    the method further comprises dividing the plurality of light emitting elements sealed with the phosphor-dispersed glass on the mounting portion into a plurality of light emitting devices.

4. The method according to claim 3, further comprising:
    forming a phosphor layer including a phosphor different from the phosphor powder on a surface of the phosphor-dispersed glass after sealing the light emitting elements or dividing the plurality of light emitting elements.

5. The method according to claim 1, further comprising:
    processing the phosphor-dispersed glass into a plate, wherein the plate phosphor-dispersed glass is fusion-bonded onto the mounting portion.

6. The method according to claim 1, wherein the glass powder is prepared by being classified by a wet classification and then dried.

7. The method according to claim 1, further comprising adding a light diffusing powder to the mixed powder during said mixing.

8. The method according to claim 1, wherein the phosphor powder is dispersed in the glass powder before said heating and softening.

9. The method according to claim 1, wherein a diameter of a glass particle in the glass powder is less than about 200μm.

10. The method according to claim 1, wherein the fusion-bonding comprises:
    placing the phosphor-dispersed glass on an upper mold comprising a first heater;
    placing the mounting portion on a lower mold comprising a second heater; and
    pressing the upper mold and the lower mold together at a range of about 20 to 40 kgf/cm$^2$.

11. The method according to claim 1, wherein a ratio of a thermal expansion coefficient of the phosphor-dispersed glass to a thermal expansion coefficient of the mounting portion is about 0.85 or more.

12. The method according to claim 1, wherein the heating and softening is conducted at a temperature that is within about 200° C. from a yielding point of the glass powder.

13. A method of making a phosphor containing glass plate, comprising:
    mixing a glass powder with a phosphor powder including at least one of a sulfide phosphor, an aluminate phosphor and a silicate phosphor to produce a mixed powder in which the phosphor powder is dispersed in the glass powder;

heating and softening the mixed powder to provide an integrated material, and subsequently solidifying the integrated material to provide a phosphor-dispersed glass; and processing the phosphor-dispersed glass into a plate.

14. The method according to claim 13, wherein the mixed powder is heated to provide the integrated material while applying a pressure thereto.

15. The method according to claim 13, wherein the glass powder is prepared by being classified by a wet classification and then dried.

16. The method according to claim 7, wherein said diffusing powder comprises one of a zirconia, an alumina, and a silica.

17. The method according to claim 13, wherein the heating and softening is conducted at a temperature that is within about 200° C. from a yielding point of the glass powder.

18. The method according to claim 13, wherein a diameter of a glass particle in the glass powder is less than about 200 μm.

* * * * *